United States Patent [19]

Minks et al.

[11] Patent Number: 4,580,005

[45] Date of Patent: Apr. 1, 1986

[54] WASH-TIGHT ELECTROMAGNETIC RELAY

[75] Inventors: Werner Minks, Heroldsberg-Kleingeschaid; Bernhard F. Nitschke, Herzogenaurach, both of Fed. Rep. of Germany

[73] Assignee: International Standard Electric Corporation, New York, N.Y.

[21] Appl. No.: 625,985

[22] Filed: Jun. 29, 1984

[30] Foreign Application Priority Data

Jul. 2, 1983 [DE] Fed. Rep. of Germany ....... 3323922

[51] Int. Cl.[4] ......................... H02G 13/08; H05K 5/00

[52] U.S. Cl. .................................... 174/52 S; 335/202

[58] Field of Search ................... 335/78, 79, 202, 151; 174/52 S, 52 PE, 17.05; 200/148 G; 220/89 B, 364, 361, 363; 29/622

[56] References Cited

U.S. PATENT DOCUMENTS 2,303,359 12/1942 Hothersall ........................... 220/263
2,454,572 11/1948 Roovers ........................... 174/17.05
4,437,231 3/1984 Zupancic ........................ 220/364 X

FOREIGN PATENT DOCUMENTS 0053870 6/1982 European Pat. Off. .
2618492 4/1976 Fed. Rep. of Germany .

*Primary Examiner*—Harold Broome
*Attorney, Agent, or Firm*—T. L. Peterson; J. S. Christopher

[57] ABSTRACT

A wash-tight electromagnetic relay having a housing including a bottom part and a cover part. The cover part includes a top side in which a spigot projecting inwardly toward the relay is formed and which defines a borehole extending through the spigot to a spigot bottom having an opening. The borehole opens outwardly from the cover part permitting a ball to be tightly pressed therein. The bottom part is sealed to the cover part by a sealing material and the relay interior is degassed to exhaust gas contaminants, filled with an inert atmosphere and sealed by the ball to prevent the entry of further gas contaminants.

8 Claims, 3 Drawing Figures

WASH-TIGHT ELECTROMAGNETIC RELAY

BACKGROUND OF THE INVENTION

1. Field of the Invention

The invention relates generally to electromagnetic relays and more particularly to wash-tight electomagnetic relays housed within an inert atmosphere.

2. Description of the Prior Art

In the past, electromagnetic relays have been enclosed within a housing which included an atmosphere containing air. A problem was created because the air included a plurality of gases which contaminated the inner atmosphere of the relay by causing oxidation of the relay electrical components. In order to eliminate the entry of air into the relay housing, a method in the prior art was developed to seal the relay housing. The method included sealing the housing by pouring a self-setting artificial resin onto a base of the relay housing for sealing each penetration through the housing base and sealing the interfacing seam between the relay housing and the housing base. Although air was prevented from entering the relay housing, a new problem was created in that the self-setting aftificial resin produced additional gases. The additional gases also contaminated the inner atmosphere of the relay housing again resulting in oxidation of the relay electrical components.

One attempt in the prior art to solve these problems was disclosed in the German Published Patent Application (DE-OS) No. 26 18 492. The application (DE-OS) No. 26 18 492 discloses a relay having a baseplate which is overlapped by a rim portion of a relay cover. The relay cover is provided with a hump formed in the shell of the relay cover which points in the outward direction. The hump includes a central vent hole for the release of the plurality of gases from inside the relay housing. The sealing of the disclosed relay is effected with the aid for a fleece placed over the baseplate and the lower rim portion of the relay cover. The fleece includes a hole or recess through which the hump is permitted to project. The fleece and the area immediately around the hole or recess is saturated with a curable sealing compound. The central vent hole permits effecting a pressure compensation in the relay during the curing stage of the sealing compound. Subsequent to the curing stage, the central vent hole may be sealed with a viscous resin or adhesive.

A second attempt in the prior art to solve the problem of contamination of the inner relay atmosphere was disclosed in European Patent Application No. 0053870. Application No. 0053870 also discloses a relay having a vent hole to release the plurality of gases from inside the relay housing. The method of sealing is similar to that of Application (DE-OS) No. 26 18 492 except that a fleece saturated in sealing compound is not used. The vent hole in both cited applications is surrounded on the outside of the relay by an extended region for receiving the curable sealing compound. Both applications cited disclose employing the self-setting or hardening (duroplastic) artificial resin to seal the vent hole subsequent to curing the sealing compound. Thus, the additional gases produced by the self-setting artificial resin continue to contaminate the inner atmosphere of the relay.

SUMMARY OF THE PRESENT INVENTION

It is therefore an object of the present invention to provide an improved wash-tight electromagnetic relay having an inner atmosphere free of gaseous contaminants.

It is a further object to provide an improved wash-tight electromagnetic relay having a vent opening which is hermetically sealed by a ball.

It is a further object to provide an improved wash-tight electromagnetic relay having a vent opening which is hermetically sealed by a pin.

It is a further object to provide an improved wash-tight electromagnetic relay having an inwardly projecting degassing spigot providing a smooth relay housing.

Briefly, a preferred embodiment of the present invention includes a wash-tight electromagnetic relay having a housing with a bottom part and a cover part. The cover part has a rim portion projecting slightly over an edge of the bottom part. The cover part includes a top side in which a spigot projecting inwardly toward a center of the wash-tight electromagnetic relay is formed. The structure of the spigot forms a borehole through the center of the spigot providing access to a spigot bottom having an opening. The borehole opens outwardly from the cover part permitting a ball to be tightly pressed into the borehole. In an alternative embodiment, a pin replaces the ball such that the pin is tightly pressed into the borehole.

Initially, the bottom part of the wash-tight electromagnetic relay is sealed to the top part by a pourable self-setting sealing material. The sealing material is permitted to cure forming a wash-tight seal after which the center of the relay is degassed through the opening for exhausting a plurality of gas contaminants. The interior of the relay is then rinsed by and filled with an inert atmosphere through the opening which prevents the oxidizing of a plurality of electrical components within the relay. The opening is then sealed by the ball preventing further gas contaminants from entering the relay.

An advantage of the wash-tight electromagnetic relay of the present invention is that the inner atmosphere is free of gaseous contaminants.

Another advantage is that the wash-tight electromagnetic relay has a vent opening which is hermetically sealed by a ball.

A further advantage is that the wash-tight electromagnetic relay has a vent opening which is hermetically sealed by a pin.

A further advantage is that the wash-tight electromagnetic relay has an inwardly projecting degassing spigot which provides a smooth relay housing.

These and other objects and advantages of the present invention will no doubt become obvious to those of ordinary skill in the art after having read the following detailed description of the preferred embodiments which are illustrated in the various drawing figures.

DETAILED DESCRIPTION OF THE PREFERRED EMBODIMENT

Figure 1:
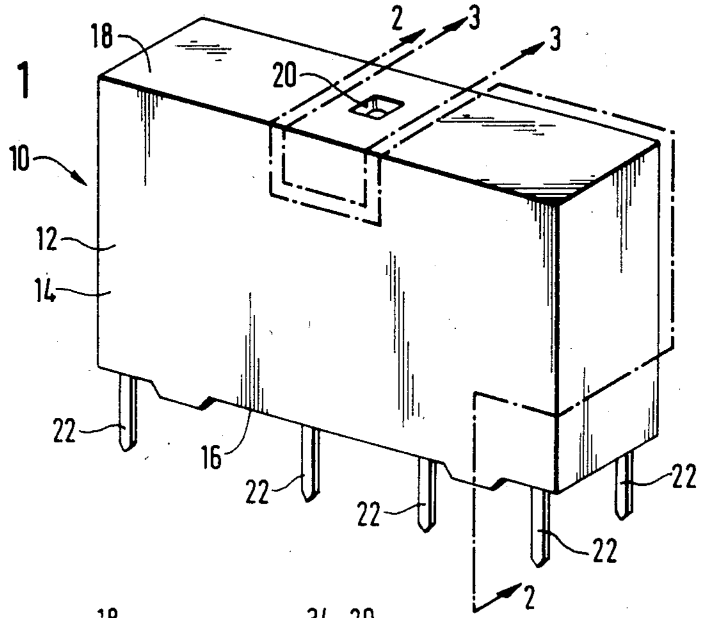
FIG. 1 is a perspective view of a wash-tight electromagnetic relay in accordance with the present invention.

In FIG. 1, there is illustrated a wash-tight electromagnetic relay referred to by the general reference character 10 and incorporating the present invention. The relay 10 includes a housing 12 having a cover part 14 and a bottom part 16 (shown in FIG. 2). The cover part 14 includes a top side 18 having a borehole 20 therein. Extending from the bottom part 16 of housing 12 is a plurality of terminal connectors 22. The housing 12 completely surrounds the relay 10.

Figure 2:
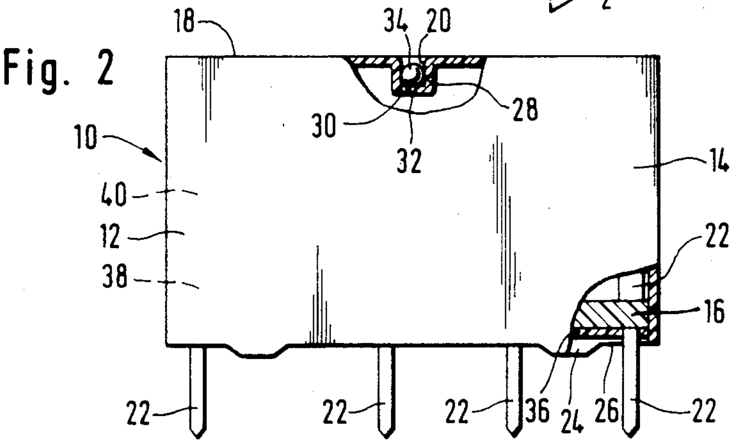
FIG. 2 is a frontal elevational view in partial cross section of the wash-tight electromagnetic relay taken along line 2—2 of FIG. 1.

FIG. 2 illustrates the wash-tight electromagnetic relay 10 of FIG. 1 in greater detail. The housing 12 further includes a rim portion 24 of the cover part 14 which slightly projects over a bottom surface 26. Within the top side 18 of cover part 14, a spigot 28 is formed. The spigot 28 includes a bottom 30 with an opening 32 therein. Note that the bottom 30 of spigot 28 is cylindrical in shape and projects inwardly toward an interior of relay 10. It is the interior of the spigot 28 that forms the borehole 20 in the top side 18. The borehole 20 receives a ball 34 which is pressed therein and seated upon the bottom 30 over the opening 32. Also, a layer of sealing material 36 is set onto the bottom part 16.

The housing 12 is comprised of an elastically deformable material such as polypropylene, polyethylene or any other like suitable material. The outer surface of the spigot 28 is cylindrical in shape while the outwardly opening borehole 20, which is the inner surface of spigot 28, is cylindrical in the preferred embodiment. However, the outwardly opening borehole 20 may be funnel shaped or the borehole 20 may be cylindrical at the bottom 30 of spigot 28 and funnel shaped where the borehole 20 opens outwardly from the cover part 14. Since the spigot 28 is inwardly projecting, the outer surface of the relay 10 remains smooth.

The relay 10 includes a plurality of electrical components 38 such as contacts, an armature and the like. With the relay 10 in the upside down position, the layer of sealing material 36 is applied to the bottom surface 26. The layer of sealing material 36 is a liquid which is self-setting and hardening and may be a duroplastic material such as an epoxy resin or a polyester resin. The layer of sealing material 36 is poured onto the bottom surface 26 and seals the points of separation between the cover part 14 and the bottom part 16 in addition to the points of separation between each of the plurality of terminal connectors 22 extending through the bottom surface 26 and the bottom surface 26 itself. The layer of sealing material 36 is permitted to cure or slightly gell to form a wash-tight seal about the bottom surface 26. The relay 10 is then orientated into the upright position.

The opening 32 of spigot 28 provides access to the interior of the relay 10 and is employed for degassing and exhausting a plurality of gas contaminants 40 within the relay 10. Then the interior of the relay 10 is rinsed with an inert gas, exhausted and then refilled such that the interior of the relay 10 is exposed to an inert environment. This procedure prevents the oxidation of the contacts and armature of the plurality of electrical components 38. The inert environment may include either argon, nitrogen or other acceptable inert gas. While the opening 32 remains unsealed, the relay 10 can be degassed and filled with the inert environment. Then, the relay 10 is finally sealed by tightly pressing the ball 34 into the borehole 20 sealing the opening 32 of the bottom 30. The ball 34 hermetically seals the relay 10 from the re-entry of the plurality of gas contaminants 40. Because the instant invention does not employ a self-setting artificial resin to seal the opening 32, the inner atmosphere of the relay 10 is not subjected to additional contamination caused by gases produced by the self-setting artificial resin. The layer of sealing material 36 is hardened and cured prior to the degassing of relay 10 and thus does not contribute to the plurality of gas contaminants 40 attempting to re-enter the relay 10. Thus, according to the preferred embodiment of the instant invention, the opening 32 in the bottom 30 should be provided for after the sealing of the bottom surface 26 by the layer of sealing material 36 and after the curing thereof. This procedure permits an air cushion to form on the inside of relay 10 while the layer of sealing material 36 is poured onto the bottom surface 26. Also, the procedure permits only a limited portion of the layer of sealing material 36, while in the liquid state, to flow into relay 10. Thus, the plurality of electrical components 38 are not damaged by contacting the layer of sealing material 36. The ball 34 may be formed out of a plastics material, in particular, any plastic which is harder and more rigid than the elastically deformable material of which the housing 12 is comprised. The ball 34 may also be fashioned out of metal, in particular, steel. By requiring the ball 34 to be comprised of a material which is harder than the material of housing 12 and the spigot 28, the ball 34 will not wear out and an effective seal will be maintained.

The opening 32 is circular and has a diameter which is chosen to be smaller than the largest dimension of the bottom 30 of spigot 28. Since the borehole 20 may be either cylindrical or funnel shaped, the geometry of the bottom 30 may not be circular. However, if the opening 32 is smaller than the largest dimension of the bottom 30, the bottom 30 will act as a limit stop for the ball 34 pressed into the borehole 20. This design facilitates a superior seal because the ball 34 does not need to be positioned to be pressed into borehole 20, does not require a special guide and may be pressed in with the aid of a plunger or stamp.

Figure 3:
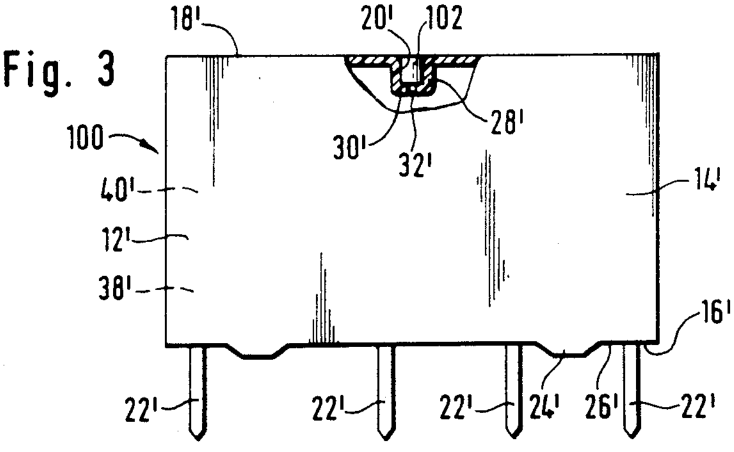
FIG. 3 is a frontal elevational view in partial cross section of the wash-tight electromagnetic relay taken along line 3—3 of FIG. 1.

In FIG. 3, there is illustrated an alternative embodiment of the wash-tight electromagnetic relay referred to by the general reference character 100 and incorporating the present invention. Those elements of the relay 100 which are duplicate to elements of the relay 10 are identified by a prime designation. Note that each element of relay 100 is duplicate to each element of relay 10 except that relay 100 does not have the ball 34. A housing 12' surrounds the relay 100 and includes a cover part 14' and a bottom part 16'. The cover part 14' includes a top side 18' having a borehole 20' therein. Extending from the bottom part 16' is a plurality of terminal connectors 22'. A rim portion 24' projects slightly over a bottom surface 26' and a spigot 28' is formed within the top side 18'. The spigot 28' includes a bottom 30' with an opening 32' and is cylindrical and projects inwardly toward an interior of relay 100. The interior of spigot 28' forms borehole 20' which receives a pin 102 which is pressed therein and seated on bottom 30'. The operation and function of each element of relay 100 is as previously described with respect to relay 10. After relay 100 has been degassed, rinsed and filled with an inert atmosphere, relay 100 is sealed by tightly pressing the pin 102 into the borehole 20' sealing the opening 32' of the bottom 30'. The pin 102 hermetically seals the relay 100 protecting a plurality of electrical components 38' from the re-entry of a plurality of gas contaminants 40'. The pin 102 may be formed out of a plastics material, in particular, any plastic material which is harder and more rigid than the elastically deformable material of which housing 12' is comprised. The pin 102 may also be fashioned out of metal such as steel. By requiring the pin 102 to be comprised of a material which is harder than the material of housing 12' and spigot 28', the pin 102 will not wear out and an effective seal will be maintained. The opening 32' is circular and has a diameter smaller than the largest dimension of bottom 30'. Thus, bottom 30' acts as a limit stop for the pin 102 pressed into the borehole 20'. However, the pin 102 does have to be positioned to be pressed into borehole 20'.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A wash-tight electromagnetic relay comprising, in combination:

a housing for surrounding an electromagnetic relay, said housing including a bottom part and a cover part, said cover part having a rim portion projecting slightly over an edge of said bottom part;

a spigot formed within a top side of said cover part of said housing and projecting inwardly toward an interior of said housing, an inner surface of said spigot being cylindrical in shape and including a bottom having a central opening for degassing and inserting an inert gas into said housing for the wash-tight electromagnetic relay, said opening of said spigot bottom being circular of a predetermined diameter, said diameter being smaller than a largest dimension of said bottom;

a borehole formed within said spigot for providing external access to said opening within said bottom of said spigot and for facilitating said degassing and said inserting of said inert gas, said borehole opening outward from said cover part; and a nonresilient ball tightly pressed within said borehole against said central opening for hermetically sealing said opening within said spigot bottom, said bottom acting as a limit stop for said ball pressed into said borehole against said opening, and said ball being comprised of a material harder than the material of said spigot into which said borehole is formed.

2. The wash-tight electromagnetic relay of claim 1 wherein said outwardly opening borehole is cylindrically shaped.

3. The wash-tight electromagnetic relay of claim 1 wherein said outwardly opening borehole is funnel shaped.

4. The wash-tight electromagnetic relay of claim 1 wherein said borehole is cylindrically shaped at said bottom of said spigot and funnel shaped where said borehole opens outwardly from said cover part.

5. The wash-tight electromagnetic relay of claim 1 wherein said ball is comprised of metal.

6. The wash-tight electromagnetic relay of claim 1 wherein said ball is comprised of a hard rigid plastic.

7. The wash-tight electromagnetic relay of claim 1 wherein said top side of said cover part has a smooth surface.

8. A wash-tight electromagnetic relay comprising, in combination:

a housing for surrounding a wash-tight electromagnetic relay, said housing including a bottom part and a cover part, said cover part having a rim portion projecting slightly over an edge of said bottom part;

a spigot formed within a top side of said cover part of said housing and projecting inwardly toward an interior of the wash-tight electromagnetic relay, an outer surface of said spigot being cylindrical in shape and including a bottom having an opening for degassing and inserting an inert gas into the wash-tight electromagnetic relay;

a cylindrical borehole formed within said spigot for providing external access to said opening within said bottom of said spigot and for facilitating said degassing and said inserting of said inert gas, said borehole opening outward from said cover part; and a nonresilient cylindrical pin tightly pressed within said borehole for hermetically sealing said opening within said spigot bottom.

* * * * *